(12) United States Patent
Joo et al.

(10) Patent No.: US 9,267,202 B2
(45) Date of Patent: Feb. 23, 2016

(54) DEPOSITION APPARATUS AND METHOD OF MANUFACTURING ORGANIC LIGHT EMITTING DIODE DISPLAY

(71) Applicant: Samsung Display Co., Ltd., Yongin, Gyeonggi-Do (KR)

(72) Inventors: Sung-Joong Joo, Yongin (KR); You-Min Cha, Yongin (KR); Seuk-Hwan Park, Yongin (KR)

(73) Assignee: Samsung Display Co., Ltd., Yongin-Si (KR)

( * ) Notice: Subject to any disclaimer, the term of this patent is extended or adjusted under 35 U.S.C. 154(b) by 181 days.

(21) Appl. No.: 14/074,629

(22) Filed: Nov. 7, 2013

(65) Prior Publication Data

US 2014/0322852 A1    Oct. 30, 2014

(30) Foreign Application Priority Data

Apr. 26, 2013    (KR) .................. 10-2013-0046775

(51) Int. Cl.
  *H01L 51/00*    (2006.01)
  *C23C 14/56*    (2006.01)
  *C23C 14/50*    (2006.01)
  *H01L 51/56*    (2006.01)

(52) U.S. Cl.
  CPC .............. *C23C 14/568* (2013.01); *C23C 14/50* (2013.01); *H01L 51/0011* (2013.01); *H01L 51/56* (2013.01)

(58) Field of Classification Search
  None
  See application file for complete search history.

(56) References Cited

FOREIGN PATENT DOCUMENTS

| KR | 10-2005-0038121 A | 4/2005 |
|----|----|----|
| KR | 10-2006-0031968 A | 4/2006 |
| KR | 10-2010-0108994 A | 10/2010 |
| KR | 1020100108994 | * 10/2010 |
| KR | 10-2011-0035867 A | 4/2011 |
| KR | 10-2012-0039944 A | 4/2012 |

* cited by examiner

*Primary Examiner* — Nathan T Leong
(74) *Attorney, Agent, or Firm* — Knobbe Martens Olson & Bear LLP (57) ABSTRACT

A deposition apparatus includes a deposition chamber, a plurality of substrate holders comprising a first holder configured to maintain a substrate at a first substrate position in the deposition chamber and a second holder configured to maintain another substrate at a second substrate position in the deposition chamber, a deposition source disposed in the deposition chamber and configured to supply a deposition material to apply onto substrates placed at the first and second substrate positions, and a deposition source transfer mechanism configured to move the deposition source to be opposite to one of the first and second substrates in a first direction, a substrate transfer mechanism configured to transfer a substrate in a second direction to or from the first substrate position and further configured to transfer another substrate in the second direction to or from the second substrate position.

5 Claims, 11 Drawing Sheets

DEPOSITION APPARATUS AND METHOD OF MANUFACTURING ORGANIC LIGHT EMITTING DIODE DISPLAY

CROSS-REFERENCE TO RELATED APPLICATION

This application claims priority to and the benefit of Korean Patent Application No. 10-2013-0046775 filed in the Korean Intellectual Property Office on Apr. 26, 2013, the entire contents of which are incorporated herein by reference.

BACKGROUND (a) Field

The present disclosure relates to a deposition apparatus, a deposition system comprising the deposition apparatus and a method of manufacturing an organic light emitting diode display.

(b) Discussion of the Related Technology

An organic light emitting diode (OLED) display is a flat panel display which can be made lightweight and thin because it has a self-luminous characteristic and requires no separate light source. Particularly, the OLED display exhibits quality characteristics such as low power consumption, high luminance, high response speed, and as such, the OLED display receives much attention as a next-generation display device.

In general, an OLED display includes an organic light emitting element including an anode, an organic emission layer, and a cathode. Holes and electrons are injected from the anode and the cathode, respectively, to form excitons, and the excitons make a transition to a ground state, thereby causing the organic light emitting diode to emit light.

The anode and the cathode may be formed of a metal thin film or a transparent conductive thin film and the organic emission layer may be formed of at least one organic thin film. A vacuum deposition method may be used to form such an organic thin film, a metal thin film, and the like, on a substrate of the organic light emitting diode display. Generally, the vacuum deposition method is used for forming an organic thin film, a metal thin film, and the like. In a deposition device including a deposition source, a deposition material is inserted into a crucible and heated for deposition of the deposition material on the substrate such that a thin film is formed.

The above information disclosed in this Background section is only for enhancement of understanding of the background of the invention and therefore it may contain information that does not form the prior art.

SUMMARY

One aspect of the present invention provides a deposition apparatus that can process a plurality of substrates generally in parallel and minimize process standby time such as alignment of substrates and deposition masks and alignment time to achieve high productivity, and a deposition system including the same.

In addition, another aspect of the present invention provides a manufacturing method of an organic light emitting diode display using a deposition chamber and a deposition system.

A deposition apparatus according to an exemplary embodiment includes: a deposition chamber; a plurality of substrate holders comprising a first holder configured to maintain a substrate at a first substrate position in the deposition chamber and a second holder configured to maintain another substrate at a second substrate position in the deposition chamber, a deposition source disposed in the deposition chamber and configured to supply a deposition material to apply onto substrates placed at the first and second substrate positions, and a deposition source transfer mechanism configured to move the deposition source to be opposite to one of the first and second substrates in a first direction, a substrate transfer mechanism configured to transfer a substrate in a second direction to or from the first substrate position and further configured to transfer another substrate in the second direction to or from the second substrate position.

The deposition chamber may further include a mask transfer mechanism configured to transfer at least one deposition mask to a first mask position disposed between the first substrate position and the first source position and a second mask position disposed between the second substrate position and the second source position.

The deposition chamber may further include a mask storing chamber attached to the deposition chamber and configured to store at least a deposition mask, and the mask storing chamber is connected with the mask transfer mechanism.

The mask transfer mechanism may be provided in one side end of the deposition chamber along the first direction and is configured to move a mask along the first direction between the mask storing chamber and the deposition chamber.

The deposition chamber may further include a mask cleansing chamber connected with the mask storing chamber and the deposition chamber and cleansing the deposition mask.

The mask cleansing chamber may be provided between the deposition chamber and the mask storing chamber.

The deposition chamber may further include an alignment device configured to align the respective substrates and the deposition masks.

The mask transfer mechanism may include a pair of rails extending in the first direction, the deposition mask comprises a mask main body that a shielding portion and an opening are formed and a frame supported by the rails by fixing the mask main body, and the frame of the deposition mask may further include a protection plate surrounding the rails.

A deposition system according to an exemplary embodiment includes a plurality of the deposition apparatus each of which comprises the deposition chamber, and a plurality of transfer chambers provided between and connect two immediately neighboring deposition chambers.

The deposition system may a mask transfer mechanism configured to transfer at least one mask to a first mask position disposed between the first substrate position and the first source position and to a second mask position disposed between the second substrate position and the second source position.

The deposition system may be configured to coordinate the substrate transfer mechanism and the mask transfer mechanism such that when a substrate is provided into the deposition chamber from the transfer chamber, the substrate is transferred along the second direction, and a deposition mask is transferred along the first direction that crosses the second direction.

The transfer chamber may accommodate the substrate transfer mechanism.

The deposition chamber may further include a buffer chamber connected to the transfer chamber. In this case, the substrate transfer portion may include a robot arm structure.

A manufacturing method of an organic light emitting diode display according to an exemplary embodiment includes: providing the deposition apparatus, transferring a first substrate and a second substrate independently into the deposition chamber to place the first substrate at the first substrate position and the second substrate at the second substrate position, providing a first deposition mask and a second deposition mask into the deposition chamber, aligning the first substrate and the first deposition mask at a first alignment location, transferring the deposition source to the first alignment location, applying a deposition material to the first substrate, aligning the second substrate and the second deposition mask at a second alignment location, transferring the deposition source to the second alignment location; and applying the deposition material to the second substrate.

The alignment to the second alignment location may be performed while the deposition material is applied to the first substrate.

The manufacturing method of the organic light emitting diode display may further include, after the spraying of the deposition material to the first substrate, discharging the first substrate from the deposition chamber.

A manufacturing method of an organic light emitting diode display according to another exemplary embodiment includes: providing the deposition apparatus, transferring a first substrate and a second substrate independently into the deposition chamber to place the first substrate at the first substrate position and the second substrate at the second substrate position, providing a first deposition mask and a second deposition mask into the deposition chamber, aligning the first substrate and the first deposition mask at a first alignment location, transferring the deposition source to the first alignment location, applying a deposition material to the first substrate, aligning the second substrate and the second deposition mask at a second alignment location, transferring the deposition source to the second alignment location; and applying the deposition material to the second substrate. While the deposition material is applied to the first substrate, the second substrate and the second mask are transferred to be aligned at the second alignment location. After the deposition material is applied to the first substrate, the first substrate is discharged from the deposition chamber.

The plurality of the deposition apparatuses may comprise first and second deposition apparatus, wherein the deposition materials used in the first and second deposition apparatuses are substantially different from each other.

The plurality of the deposition apparatuses may comprise first and second deposition apparatus, wherein the deposition mask used in the first deposition apparatus and the deposition mask used in the second deposition apparatus are substantially different from each other.

According to the exemplary embodiments of the present invention, a thin film process can be sequentially performed in a plurality of process lines provided in each of a plurality of deposition chambers through a single deposition source provided in each of the deposition chamber so that cost can be saved and productivity can be improved.

Further, standby time can be shortened by performing substrate transferring and substrate and mask alignment with respect to a substrate in a process line while a thin film deposition process is performed on a substrate in another process line, thereby further improving productivity.

DETAILED DESCRIPTION OF THE EMBODIMENTS

Hereinafter, a deposition chamber, a deposition system including the deposition chamber, and a manufacturing method of an organic light emitting diode display will be described in further detail with reference to the accompanying drawings. However, the present invention is not limited to the exemplary embodiments disclosed hereinafter but has many variations, and the exemplary embodiments described hereinafter are provided to make the disclosure of the present invention complete and to completely inform a person of ordinary skill in the art the scope of the present invention. In the drawings, like reference numerals refer to like elements.

In addition, unless explicitly described to the contrary, the word "comprise" and variations such as "comprises" or "comprising", will be understood to imply the inclusion of stated elements but not the exclusion of any other elements. Further, the word "on" means positioning on or below the object portion, but does not essentially mean positioning on the upper side of the object portion based on a gravity direction.

In order to form an organic thin film, a metal thin film, and the like using the vacuum deposition method, a deposition system such as a cluster-type deposition system, an inline deposition system, and the like may be used. The inline deposition system is a deposition system in which a substrate loading chamber, a substrate unloading chamber, and a plurality of deposition chambers disposed between the substrate loading chamber and the substrate unloading chamber are arranged in a row, and has a merit of shortening a process time compared to the cluster-type deposition system.

Figure 1:
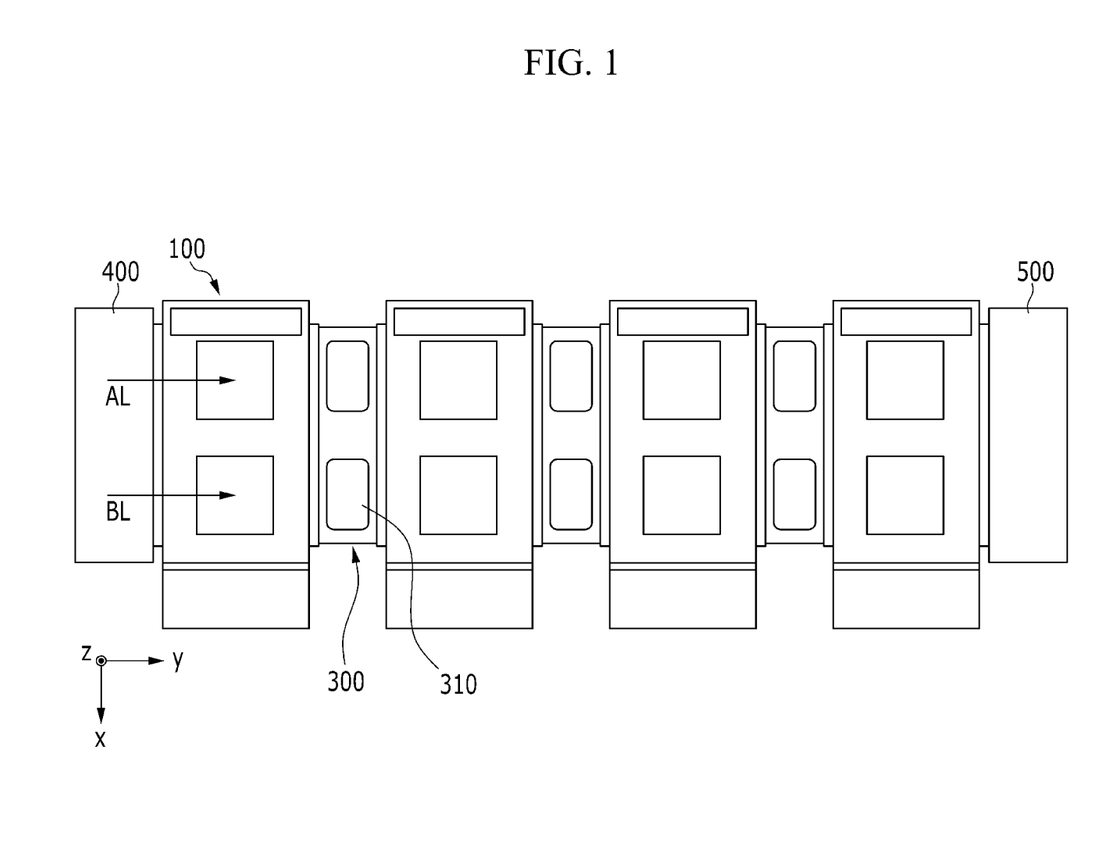
FIG. 1 is a top plan view of a deposition system according to a first exemplary embodiment.
Figure 2:
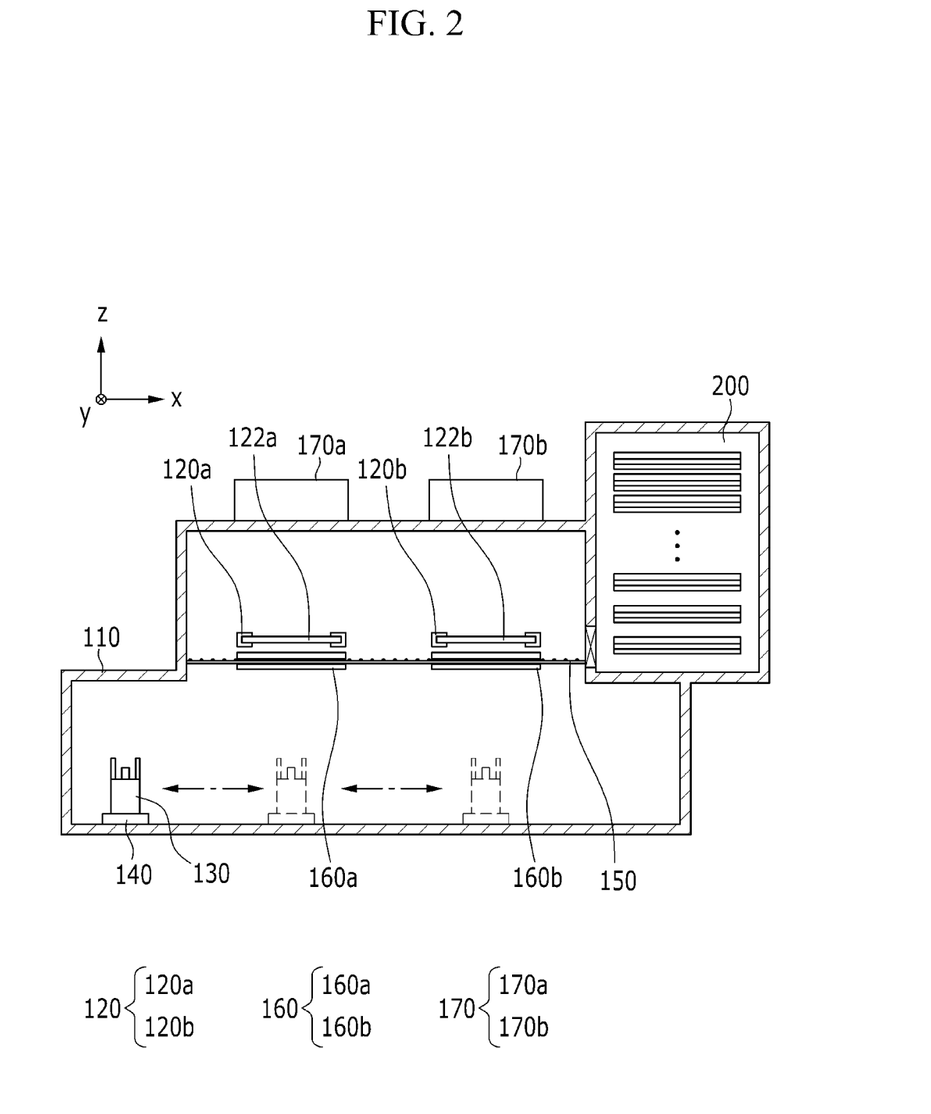
FIG. 2 is a schematic side view of a deposition chamber of the deposition system according to the first exemplary embodiment.
Figure 3:
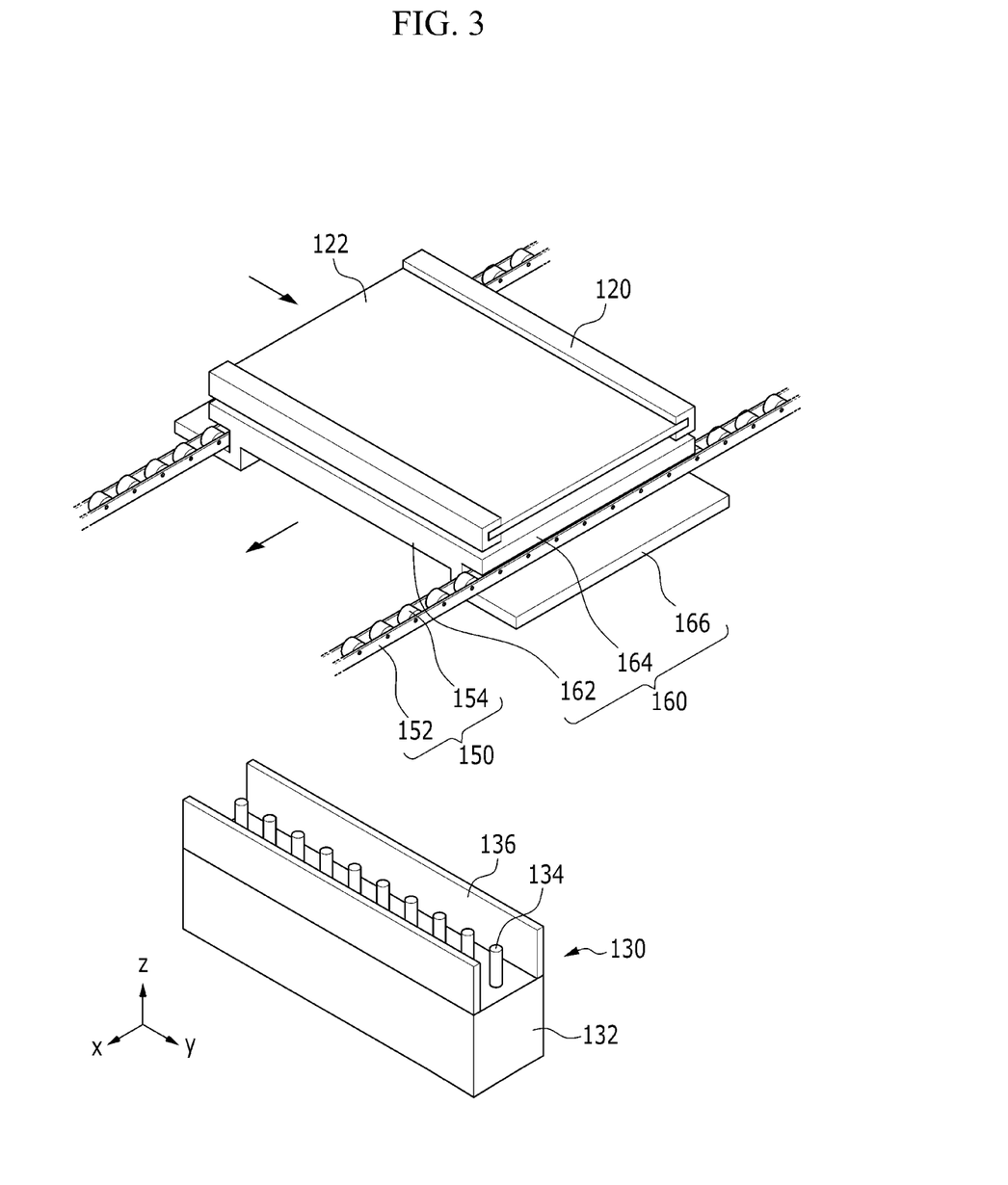
FIG. 3 is a partially enlarged view of the deposition chamber of the deposition system according to the first exemplary embodiment.

FIG. 1 is a top plan view of a deposition system according to a first exemplary embodiment, FIG. 2 is a schematic side view of a deposition chamber according to the first exemplary embodiment, and FIG. 3 is a partial exploded perspective view of the deposition chamber according to the first exemplary embodiment.

Referring to FIG. 1, a deposition system according to the first exemplary embodiment includes a plurality of deposition chambers 100 and a plurality of transfer chambers 300.

The deposition chamber 100 is a means for forming a thin film of a substrate 122, and is provided in plural corresponding to the number of thin films formed on the substrate 122.

For example, when a display device formed on the substrate 122 is an organic light emitting diode (OLED) display, an emission layer ELM is formed, and a hole injection layer (HIL), a hole transport layer (HTL), an electron transporting layer ETL, and an electron injection layer may be further formed. In addition, a metal thin film functioning as a cathode or an anode or a transparent conductive thin film may be further formed on the substrate 122. The thin films are formed in different deposition chambers 100, and therefore the number of the deposition chambers 100 according the present exemplary embodiment corresponds to the number of an organic thin film, a metal thin film, and the like.

Referring to FIG. 2, each of the deposition chambers 100 includes a chamber main body 110, a substrate fixing portion 120, a deposition source 130, a deposition source transfer portion 140, and a mask transfer portion 150.

The chamber main body 110 defines an inner space formed therein, and performs a process for forming a thin film on the substrate 122 in the space. A vacuum pump (not shown) that decreases an internal pressure by discharging gas from the space and a venting means (not shown) that increases the internal pressure in the chamber main body by injecting a constant gas to the inner space of the chamber main body may further be provided.

The substrate 122 (122a, 122b) is transferred into the inner space of the chamber main body 110 and fixed to be opposite to a spray nozzle of the deposition source 130 by the substrate fixing portion 120 (120a and 120b). A process and structure for carrying the substrate 122 into the inner space of the chamber main body 110 and discharging the substrate 122 from the chamber main body 100 will be described later.

The substrate fixing portion or substrate holder 120 has a structure for easily attaching and detaching the substrate 112 so as to stably fix the substrate 122 while a thin film of a deposition material is formed and then discharge the substrate 122 from the inner space of the chamber main body 110 after termination of the treatment.

The substrate fixing portions 120a and 120b are provided in plural to treat a plurality of substrates in the deposition chamber 100 during one deposition process. The plurality of substrate fixing portions 120a and 120b respectively fix or hold the plurality of substrates 122a and 122b and can maintain the substrates at their deposition stations. In embodiments, the substrate holders 120a and 120b may be fixed in the deposition stations. In alternative embodiments, the substrate holders 120a and 120b may be movable to transfer substrates to the deposition stations and stop at the deposition stations to maintain the transferred substrates at the deposition stations.

In the present exemplary embodiment, the substrate fixing portion 120 is exemplarily formed of two fixing portions, i.e., the first substrate fixing portion 120a and the second substrate fixing portion 120b, but it is not restrictive. The first substrate fixing portion 120a and the second substrate fixing portion 120b fix the first substrate 122a and the second substrate 122b, respectively corresponding thereto. And the first substrate fixing portion 120a and the second substrate fixing portion 120b may be disposed generally in parallel with each other and arranged along a first direction (i.e., x-axis direction) for the respective substrates 122a and 122b to be opposite to the deposition source 130.

In addition, during a deposition process with respect to the substrates 122a and 122b, the first substrate fixing portion 120a and the second substrate fixing portion 120b may be disposed at a distance from each other, interposing a gap therebetween along the first direction so as to prevent the deposition material from being attached to the second substrate that is waiting for deposition while depositing the first substrate.

Referring to FIG. 3, as a means for discharging a deposition material for deposition to the substrate 122, the deposition source 130 is provided with a space (not shown) for containing a deposition material such as an organic material, and spray nozzles 134 spraying the deposition material are formed in one side of the deposition source 130, disposed opposite to the substrate 120.

The deposition material containing space may be formed of a ceramic material having an excellent heat emission feature, such as alumina (Al2O3), aluminum nitride (AlN), and the like, and it is not restrictive. The deposition material receiving space may be formed of various materials having excellent heat emission feature and heat resistance.

Heater (not shown) may be formed to surround the external surface of the deposition material containing space in a closely attached manner, and the heater heats the received deposition material for vaporization of the deposition material.

As shown in FIG. 3, the deposition source 130 may be provided as a linear deposition source extended in a second direction (i.e., y-axis direction) that crosses the first direction. In embodiments, the x-axis direction and the y-axis direction are generally perpendicular to each other. In this case, the linear deposition source may be extended corresponding to the length of the substrate opposite thereto.

An angle control member 136 that controls or limits a spray angle of the deposition material may be formed at the periphery area of the spray nozzles 134. As shown in FIG. 3, the angle control member 136 is extended along a length direction of the linear deposition source 130 to make the organic material uniformly sprayed on the substrate 30 by controlling a deposition angle of the deposition material sprayed from the spray nozzles 134, and prevents the deposition material from being attached to other substrate that does not experience a deposition process during the deposition process.

As a means for transferring the deposition source 130, the deposition source transfer portion or deposition source transfer mechanism 140 moves the deposition source 130 to be opposite to one of the substrates 122a and 122b. The deposition source transfer portion 140 enables a single deposition source 130 to be sequentially deposited to the plurality of substrates 122a and 122b.

When the deposition process is performed to the first substrate 122a, the deposition source 130 is disposed at a location that is opposite to the first substrate 122a through the deposition source transfer portion 140. When the deposition process for the first substrate 122a is finished, the deposition source 130 is disposed at a location that is opposite to the second substrate 122b through the deposition source transfer portion 140 for performance of the deposition process.

A plurality of deposition masks 160 includes two deposition masks 160a and 160b, and is provided as a means for forming patterns of an organic thin film on the substrate 122. In a deposition mask, openings are formed between shielding portions that block deposition of the organic material such that the organic material is deposited on the substrate 122 through the openings.

The deposition mask 160 is disposed under one surface of the substrate 122, to which the pattern of the organic thin film is to be formed. In the present exemplary embodiment, the deposition process is performed with respect to two substrates 122 in one chamber, and therefore two deposition masks 160a and 10b are used.

The two deposition masks 160a and 160b are transferred and placed to correspond to the substrates 122a and 122b by the mask transfer portion or mask transfer mechanism 150. As a means for arranging the deposition masks 160a and 160b at mask locations respectively corresponding to the substrates 122a and 122b, the mask transfer portion 150 may transfer the deposition masks 160a and 160b generally in parallel with the first direction (x-axis direction).

The mask transfer portion 150 includes a pair of rails 152 extending in the first direction (x-axis direction) as shown in FIG. 3 separated from a distance with a predetermined gap along the second direction (y-axis direction) and a plurality of rollers 154 arranged along a length direction of the pair of rails 152 and contacting the deposition mask.

When the deposition mask 160 is being transferred, friction between the deposition mask 160 and the rail 152 is reduced by the rollers 154 so that the deposition mask 160 can be smoothly transferred.

In this case, the deposition mask 160 is disposed between the pair of rails 152. And the deposition mask 160 includes a mask main body 162 where the shielding portion and the openings are formed and a frame 164 fixing the mask main body 162 and supported by the rails 152.

The deposition mask 160 may further include a protection plate 166 extending from one side of the frame 164 to prevent the deposition material from being attached to the rails 152. That is, the protection plate 166 is extended from a side opposite to the spray nozzles 134 to cover the rail 152.

In the present exemplary embodiment, the mask transfer portion 150 is illustrated as a rail, but it is not restrictive. The mask transfer portion 160 may have various shapes as long as the deposition mask 160 is transferred to one direction and arranged at a predetermined location. In addition, the deposition mask 160 may have various shapes as long as it is being supported by the mask transfer portion 150 and transferred along the mask transfer portion 150.

Referring back to FIG. 2, a mask storing chamber or mask storage 200 may further be included to store the deposition mask 160 at one side of the chamber main body 110. The mask storing chamber 200 stores a required deposition mask 160 according to the type of an organic thin film, a metal thin, film, and the like formed in each deposition chamber 100, and discharges the deposition mask 160 toward the inner space of the chamber main body 110 during the deposition process.

The mask storing chamber 200 is connected with the mask transfer portion 150 to mount the deposition mask 160 discharged from the mask storing chamber 200 to the mask transfer portion 150.

In this case, the deposition mask 160 may be mounted to the mask transfer portion 150 using a mask transfer holder (not shown).

In order to arrange the substrates 122a and 122b and the deposition masks 160a and 160b at predetermined locations, respectively, a first alignment portion 170a and a second alignment portion 170b may be formed at one side of the chamber main body 110. The first alignment portion 170a aligns the first substrate 122a and the first deposition mask 160a, and the second alignment portion 170b aligns the second substrate 122b and the second deposition mask 160b.

Figure 4:
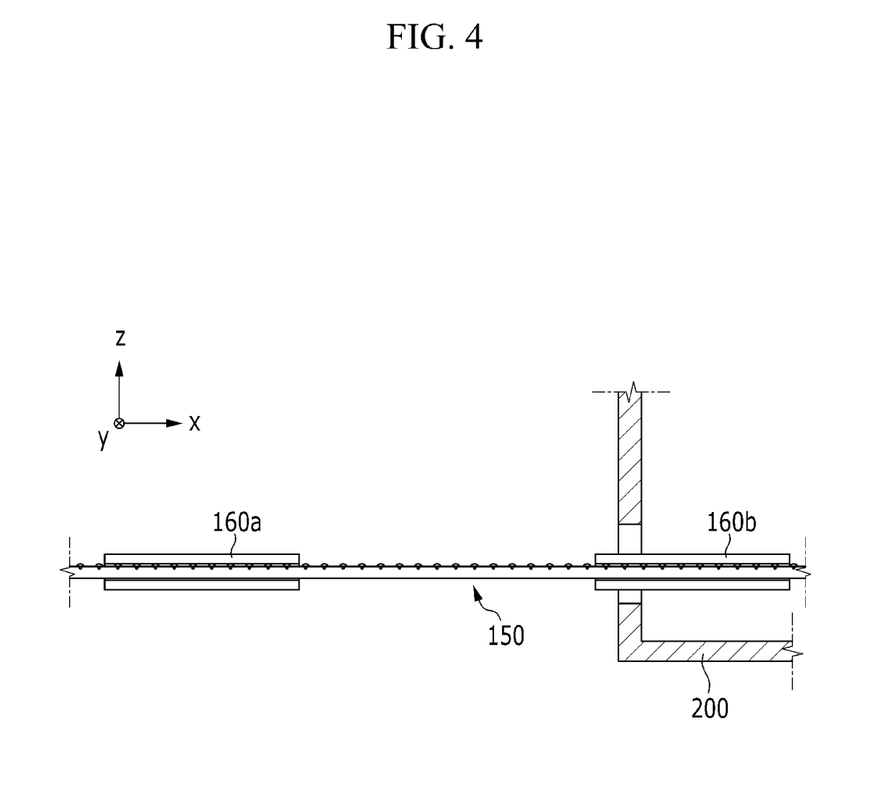
FIG. 4 is a partial enlarged view of the deposition system according to the first exemplary embodiment.

FIG. 4 is a partially exploded side view of the deposition chamber according to the first exemplary embodiment.

The mask storing chamber 200 is connected with the mask transfer portion 150 to make the deposition mask 160 transferred from the inner space of the chamber main body 110 into the mask storing chamber 200 through the mask transfer portion 150 after the deposition process is finished. In addition, the deposition mask 160 stored in the mask storing chamber 200 is carried into the deposition mask 160 again for a deposition process.

As shown in FIG. 1, the deposition system according to the exemplary embodiment includes a plurality of deposition chambers 100 and a plurality of transfer chambers 300 disposed between the deposition chambers 100 to connect neighboring deposition chambers 100.

In embodiments, the substrates 122 are provided by being transferred along a direction (for example, y-axis direction) to which the deposition chambers 100 and the transfer chambers 300 are connected, and the deposition mask 160 may be provided along another direction (for example, x-axis direction) that crosses the transfer direction of the substrate 122.

As shown in FIG. 1, when the deposition chamber 100 and the transfer chamber 300 are arranged in a row along the second direction (y-axis direction), the substrate 122 may be transferred along the alignment direction of the chambers. When the two substrates 122a and 122b are processed in a single deposition chamber 100, the two substrates 122a and 122b may be provided generally in parallel with the chamber alignment direction (refer to AL and BL of FIG. 1).

Figure 5:
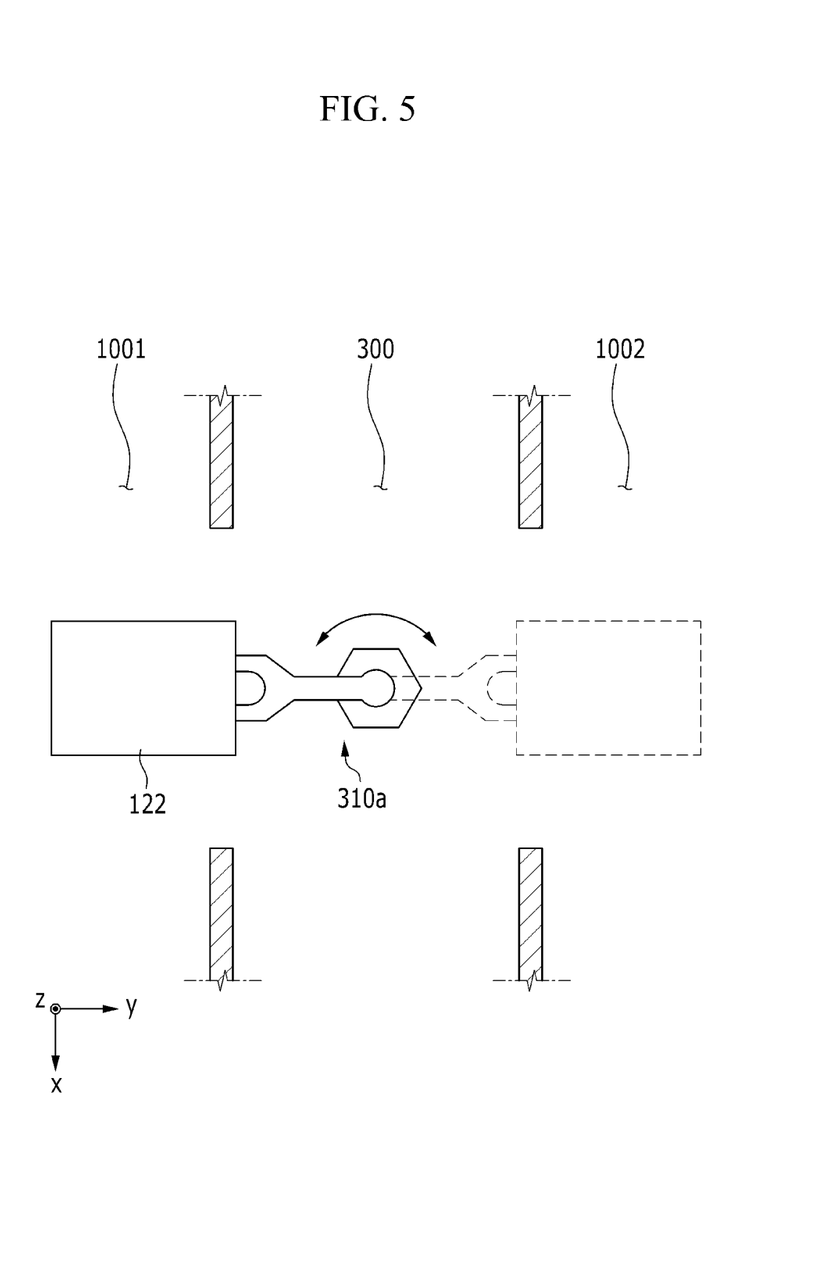
FIG. 5 and FIG. 6 are top plan views of a substrate transfer portion of the deposition system according to the first exemplary embodiment.
Figure 6:
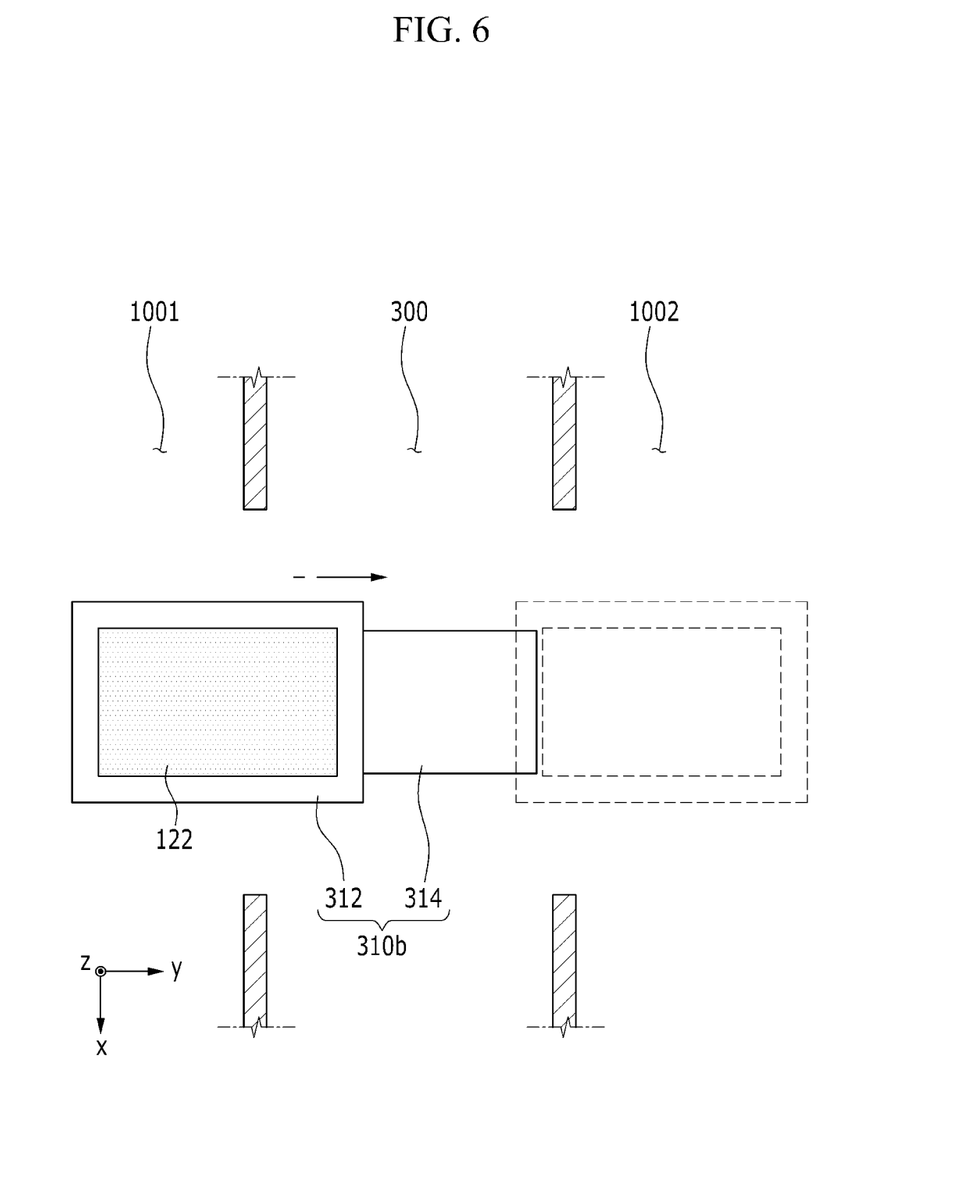

FIG. 5 and FIG. 6 are top plan views illustrating exemplary variations of the substrate transfer portion according to the first exemplary embodiment.

The transfer chamber 300 includes a substrate transfer portion or substrate transfer mechanism 310a that discharges the substrate 122 from an adjacent deposition chamber and carries the discharged substrate 122 into another deposition chamber. As shown in FIG. 5, the substrate transfer portion 310a may be formed in the shape of a robot arm. The robot arm is inserted in a deposition chamber 1001 where the deposition process is finished and grips the substrate 122, and then mounts the gripped substrate 122 in a substrate fixing portion 120 in another adjacent deposition chamber 1002 where the next deposition process is going to be performed.

In addition, as shown in FIG. 6, the substrate transfer portion 310 may be formed using a sliding method. And the substrate transfer portion 310 includes a substrate tray 312 on which the substrate 122 is mounted or placed and a sliding guide 314 along which the substrate tray 312 is slid. After the substrate tray 312 is inserted in the deposition chamber 1001 where the deposition process is finished and then the substrate 122 is mounted on the substrate tray 312, the substrate 122 is mounted to a substrate fixing portion 120 in another adjacent deposition chamber 1002 where the next deposition process is going to be performed.

In addition, the deposition system according to the exemplary embodiment may further include a loading chamber 400 and a substrate unloading chamber 500. The substrate 122 is loaded into the deposition system through the substrate loading chamber 400, and a deposition material is deposited in each of the deposition chamber 100 to form an organic thin film on the substrate 122, and then the substrate 122 is unloaded through the substrate unloading chamber 500.

A gate valve may be provided between the substrate loading chamber 400 and the deposition chamber 100, and another gate valve may be provided between the deposition chamber 100 and the substrate unloading chamber 500. Each gate valves is provided between one of the deposition chambers 100 and the immediately neighboring transfer chamber 200. Such a gate valve is opened while the substrate 122 is being transferred and closed while the organic material deposition process is performed such that the organic material deposition process can be performed in a vacuum state.

Figure 7:
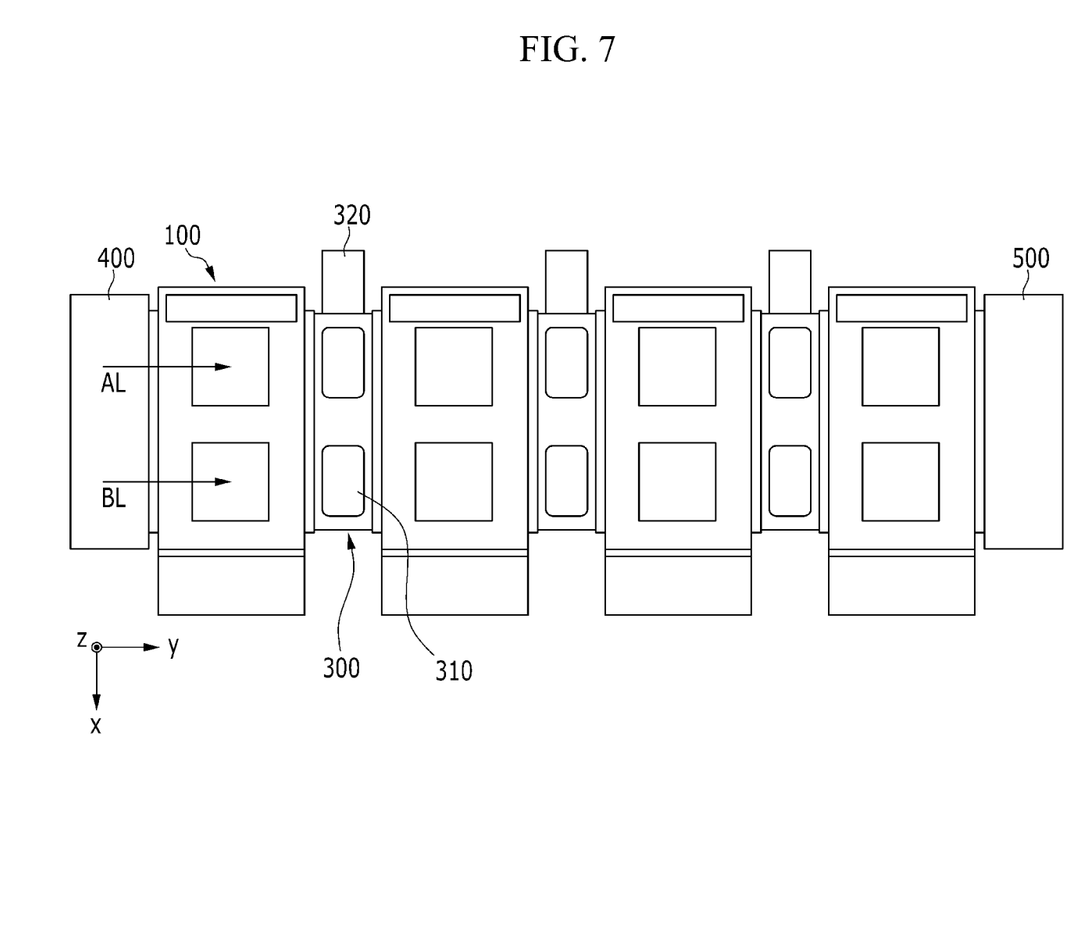
FIG. 7 is a top plan view of a deposition system according to a second exemplary embodiment.

FIG. 7 is a top plan view of a deposition system according to a second exemplary embodiment.

Referring to FIG. 7, a deposition system according to the present exemplary embodiment further includes a buffer chamber 320 connected with a transfer chamber 300 at one side of the transfer chamber 300. When the substrate 122 is damaged or a problem occurs in a deposition chamber 100 or a transfer chamber 300, the substrate 122 may be transferred into the buffer chamber 320 and then stored.

The buffer chamber 320 is provided in connection with the transfer chamber 300 at a location that is spaced apart from a transfer path of the substrate 122 in order not to interrupt transferring of the substrate 122. When the substrate transfer portion 310 of the transfer chamber 300 is provided in the shape of a robot arm, the buffer chamber 320 is provided adjacent to the substrate transfer portion 310 formed in the shape of the robot arm to temporarily store the substrate, and accordingly, a time loss that may occur during mass production can be reduced.

In the deposition system according to the present exemplary embodiment, other configuration than the buffer chamber 320 may be the same as that of the first exemplary embodiment.

Figure 8:
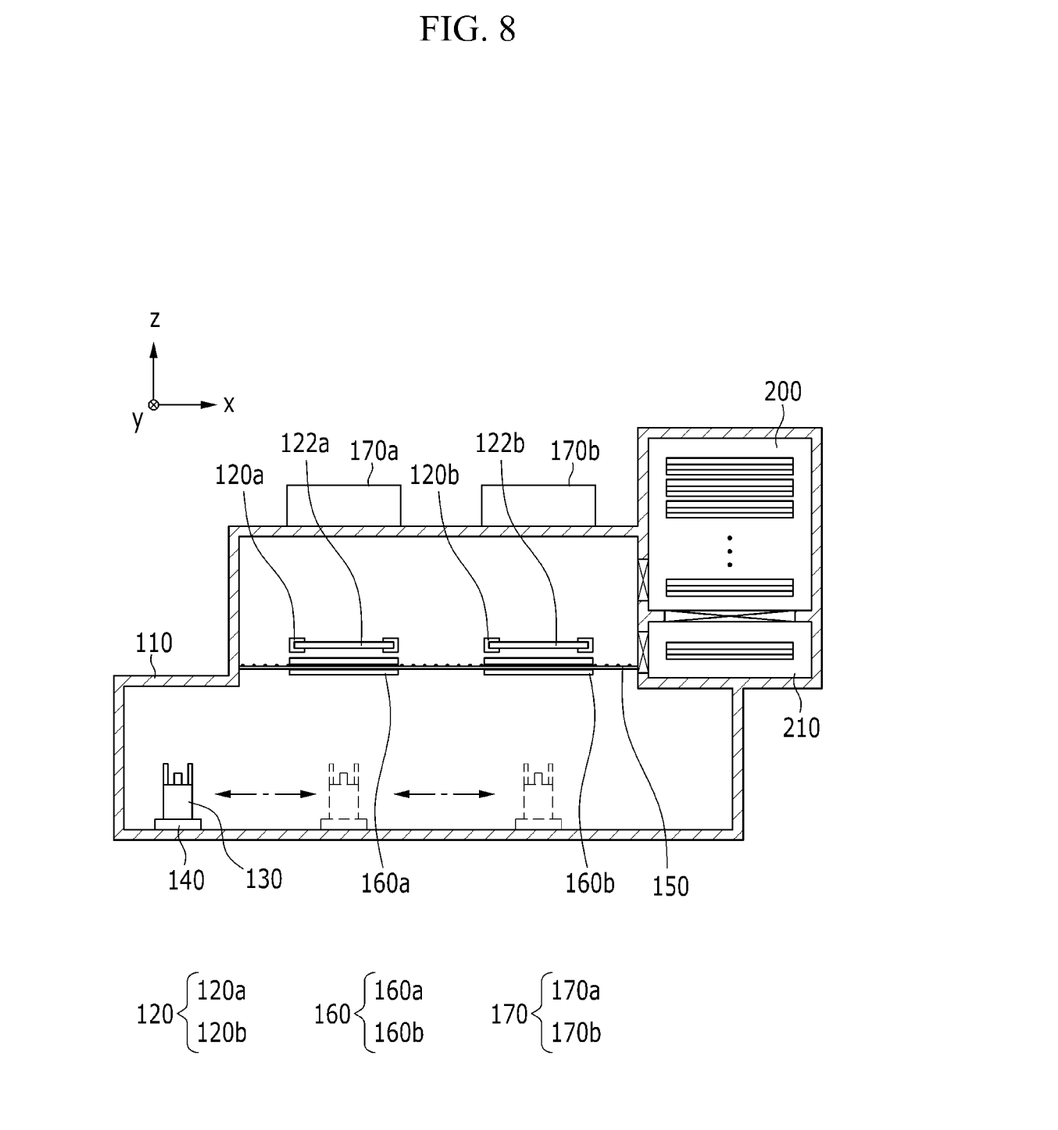
FIG. 8 is a schematic side view of a deposition chamber of a deposition system according to a third exemplary embodiment.

FIG. 8 is a schematic side view of a deposition chamber of a deposition system according to a third exemplary embodiment.

Referring to FIG. 8, in a deposition system according to the present exemplary embodiment, a mask cleansing chamber 210 connected with a mask storing chamber 200 and the inside of a chamber main body 110 and cleaning a deposition mask 160 is formed in a lower end portion of the mask storing chamber 200.

The mask cleaning chamber 210 is a device for cleaning a deposition material attached to a deposition mask after the deposition mask 160 repeats the deposition process several times, and may clean the deposition mask 160 using plasma or ultraviolet (UV) ray.

Gate values are respectively provided between the mask storing chamber 200 and the chamber main body 110, between the mask cleaning chamber 210 and the chamber main body 110, and between the mask storing chamber 200 and the mask cleaning chamber 210, and the gate valves are opened when the deposition mask 160 is transferred along the mask transfer portion 150 and the gate valves are closed when the transferring of the deposition mask 160 is finished.

The mask cleaning chamber 210 is connected with the mask transfer portion 150 and thus the deposition mask 160 transferred from the inner space of the chamber main body 110 after the deposition process can be carried into the mask cleansing chamber 210 through the mask transfer portion 150. In addition, the deposition mask 160 cleaned in the mask cleaning chamber 210 is carried back into the inner space of the chamber main body 110 for the next deposition process.

The mask transfer portion 150 may be moved so as to be connected with the mask storing chamber 200 or the mask cleaning chamber 210. For example, in FIG. 8, the mask transfer portion 150 is illustrated to be connected with the mask cleaning chamber 210, but the mask transfer portion 150 may be connected with the mask storing chamber 200 by being transferred upward.

In the deposition system according to the present exemplary embodiment, a structure, excluding the structure related to the mask cleansing chamber 210 is the same as that of the first exemplary embodiment, and a buffer chamber may be provided as in the second exemplary embodiment.

Hereinafter, the operation and the manufacturing method will be described by illustrating the deposition system according to the first exemplary embodiment, but a deposition system according to the second or third exemplary embodiment or a deposition system according to the exemplary variations may also be applicable.

Figure 9A:
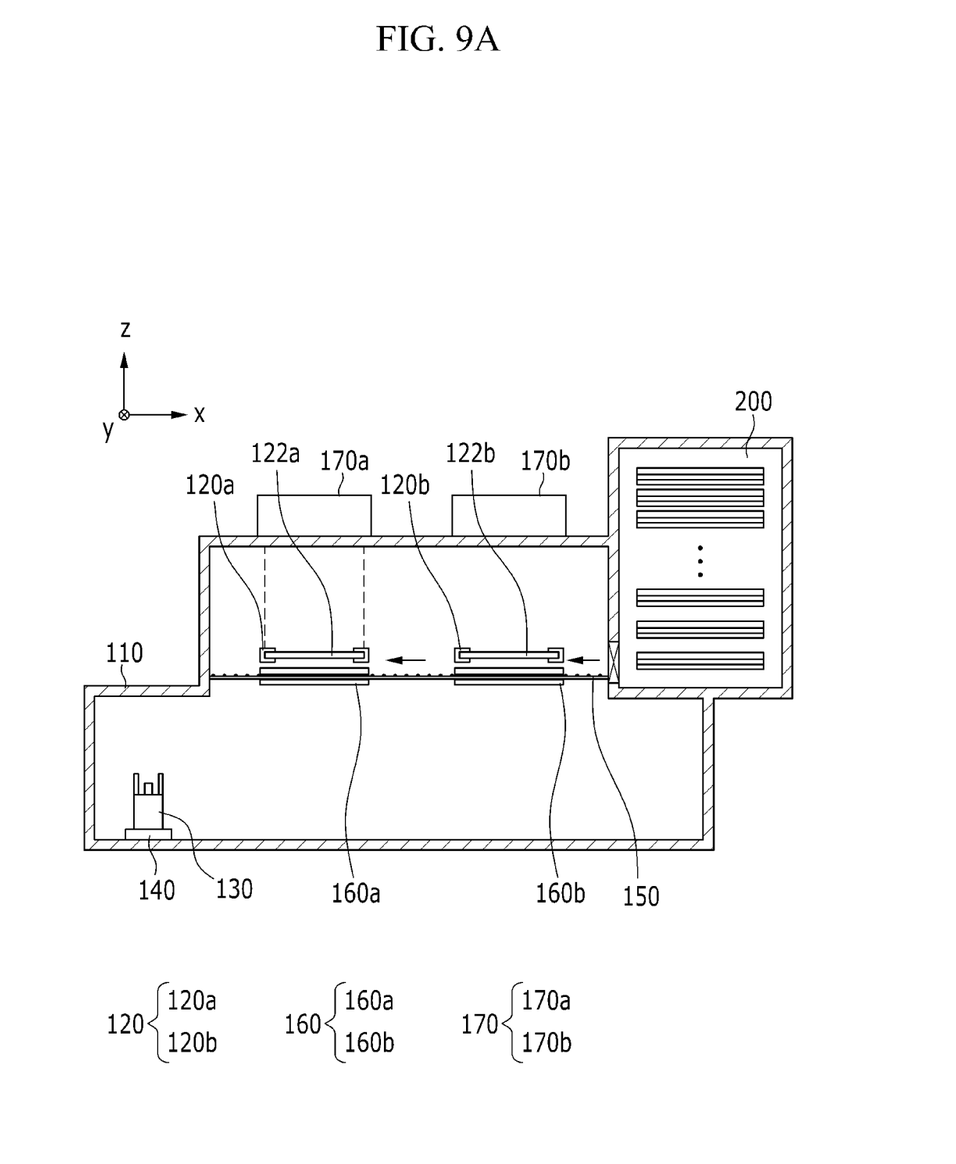
FIG. 9A to FIG. 9C are schematic diagrams of a manufacturing method of an organic light emitting diode (OLED) display according to an exemplary embodiment.
Figure 9B:
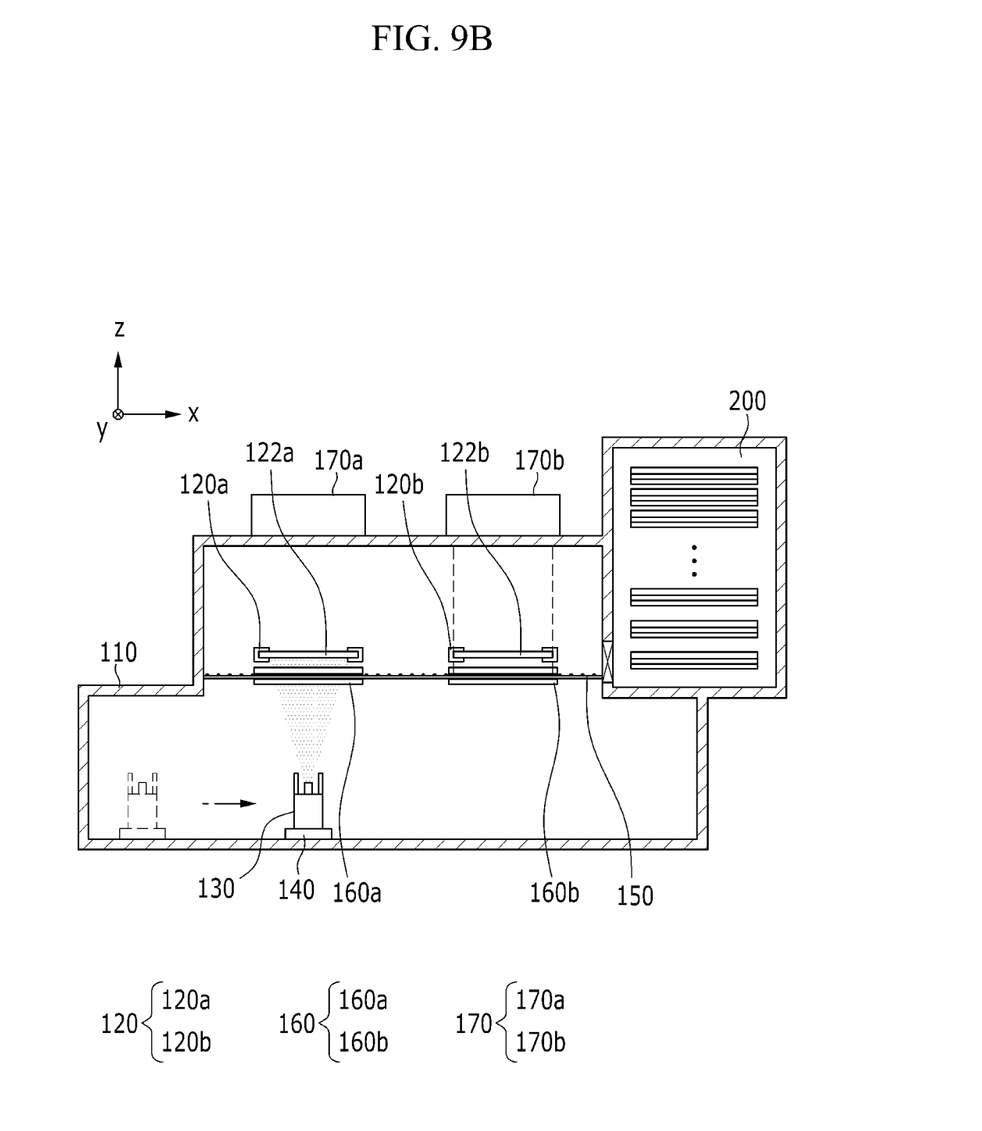
Figure 9C:
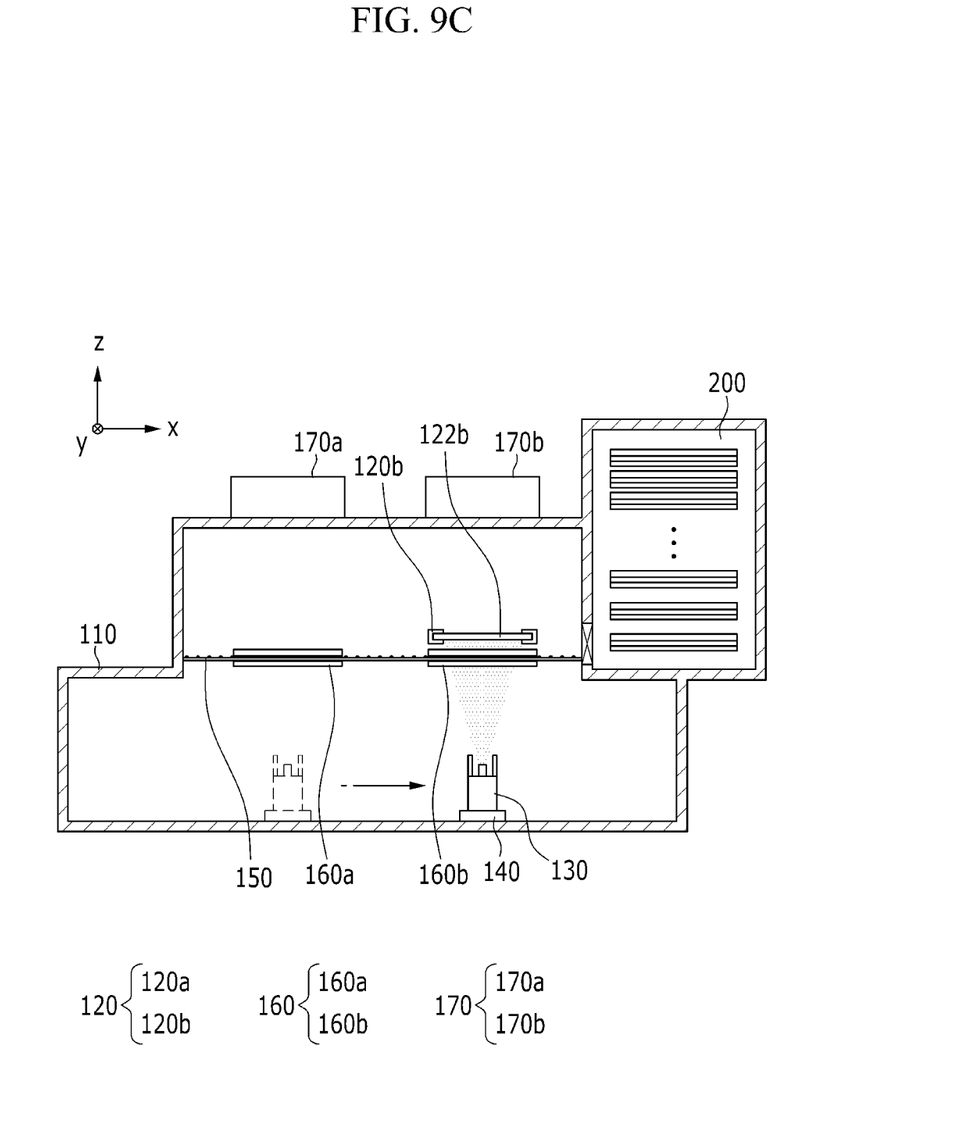

FIG. 9A to FIG. 9C are schematic diagrams sequentially illustrating a manufacturing method of an OLED display according to an exemplary embodiment.

Referring to the drawing, the manufacturing method of the OLED display according to the exemplary embodiment includes providing a deposition source, placing a mask, aligning a first substrate, transferring the deposition source, depositing the first substrate, aligning a second substrate, transferring the deposition source, and depositing the second substrate.

First, as shown in FIG. 9A, the deposition source 130 spraying the deposition material is provided in the deposition chamber 100. The first substrate 122a is inserted into the deposition chamber 100. The second substrate 122b is inserted into the deposition chamber 100 independently from the transfer of the first substrate 122a. In embodiments, the second substrate 122b can be inserted into the deposition chamber 100 while depositing the first substrate 122a.

The first substrate 122a and the second substrate 122b are inserted generally in parallel along the second direction (y-axis direction) where the deposition chamber 100 and the transfer chamber 300 are arranged (refer to AL and BL of FIG. 1). The first substrate 122a and the second substrate 122b can be arranged generally in parallel with each other, interposing a gap therebetween along the first direction that crosses the transfer direction of the first substrate 122a and the second substrate 122b.

The first deposition mask 160a and the second deposition mask 160b are transferred into the deposition chamber 100. The deposition masks 160a and 160b received in the mask storing chamber 200 are discharged and mounted on the mask transfer portion 150, and then the deposition masks 160a and 160b are transferred to predetermined locations.

That is, the first deposition mask 160a is transferred to a location corresponding to the first substrate 122a, and the second deposition mask 160b is transferred to a location corresponding to the second substrate 122b. The first substrate 122a and the first deposition mask 160a are aligned in a predetermined first alignment location through a first alignment portion 170a. In embodiments, the first deposition mask 160a and the second deposition mask 160b are transferred into the deposition chamber 100 before the first and second substrates are transferred into the chamber 100, respectively. Alternatively, the first deposition mask 160a and the second deposition mask 160b are transferred into the deposition chamber 100 after the first and second substrates are transferred into the chamber 100, respectively.

The deposition source 130 is transferred to the first alignment location, and then as shown in FIG. 9B, the deposition material received in the receiving space of the deposition source 130 is heated to be vaporized and then sprayed toward the first substrate 122a.

The second substrate 122b and the second deposition mask 160b are aligned in a predetermined second alignment location through the second alignment portion 170b. The aligning of the second substrate 122b and the second deposition mask 160b in the second alignment location may be performed while the deposition material is sprayed to the first substrate 122a. Since the second substrate 122b is aligned while the deposition material is sprayed to the first substrate 122a, a process time can be shortened.

When the deposition process with respect to the first substrate 122a is finished, as shown in FIG. 9, the deposition source 130 is transferred to the second alignment location and then the deposition material is sprayed toward the second substrate 122b.

After the deposition process with respect to the first substrate 122a is finished and before a deposition process with respect to the second substrate 122b starts, the first substrate 122b may be discharged to the outside of the deposition chamber 100. During the deposition process with respect to the second substrate 122b, the first substrate 122a may be prepared for the next deposition process by being transferred to the next deposition chamber through the transfer chamber 300. Accordingly, a process time can be shortened.

After the deposition process with respect to the second substrate 122b is finished, the second substrate 122b may also be prepared for the next process by being transferred to the next deposition chamber. Through performing deposition steps of the above-stated deposition process in each deposition chamber, a multi-layered organic thin film may be formed in the substrates 122a and 122b.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing an organic light emitting diode (OLED) display, the method comprising:
   providing deposition apparatus comprising a deposition chamber, a deposition source configured to supply a deposition material, and a deposition source transfer mechanism configured to move the deposition source between a first source position and a second source position along a first direction:
   transferring, from outside the deposition chamber, a first substrate in a second direction to place the first substrate at a first substrate position within the deposition chamber;
   subsequently aligning a first deposition mask relative to the first substrate located at the first substrate location;
   subsequently performing deposition of the first substrate by applying the deposition material to the first substrate from the deposition source located at the first source position;
   transferring, from outside the deposition chamber, a second substrate in the second direction to place the second substrate at a second substrate position within the deposition chamber;
   while performing deposition of the first substrate, aligning a second deposition mask relative to the second substrate located at the second substrate position;
   after completion of deposition of the first substrate, transferring the deposition source from the first source position to the second source position along the first direction; and
   subsequently performing deposition of the second substrate by applying the deposition material to the second substrate from the deposition source located at the second source position.

2. The method of claim 1, further comprising, while performing deposition of the second substrate, transferring, in the second direction, the first substrate from inside the deposition chamber to outside the deposition chamber.

3. A method of manufacturing an organic light emitting diode (OLED) display, the method comprising:
   providing a plurality of deposition apparatuses, each deposition apparatus comprising a deposition chamber, a deposition source configured to supply a deposition material. and a deposition source transfer mechanism configured to move the deposition source between a first source position and a second source position along a first direction, wherein the plurality of deposition apparatuses comprises a first deposition apparatus, a second deposition apparatus and a third deposition apparatus that are arranged along a second direction;
   transferring a first substrate in the second direction from the first deposition apparatus to the second deposition apparatus to place the first substrate at a first substrate position within the deposition chamber of the second deposition apparatus;
   subsequently aligning a first deposition mask relative to the first substrate located at the first substrate location;
   subsequently performing deposition of the first substrate by applying the deposition material to the first substrate from the deposition source located at the first source position;
   transferring a second substrate in the second direction from the first deposition apparatus to the second deposition apparatus to place the second substrate at a second substrate position within the deposition chamber of the second deposition apparatus;
   while performing deposition of the first substrate, aligning a second deposition mask relative to the second substrate located at the second substrate position;
   after completion of deposition of the first substrate, transferring the deposition source from the first source position to the second source position along the first direction;
   subsequently performing deposition of the second substrate by applying the deposition material to the second substrate from the deposition source located at the second source position; and
   while performing deposition of the second substrate transferring in the second direction, the first substrate from inside the deposition chamber to outside the deposition chamber.

4. The method of claim 3, wherein the deposition materials used in the first and second deposition apparatuses are substantially different from each other.

5. The method of claim 3, wherein the deposition mask used in the first deposition apparatus and the deposition mask used in the second deposition apparatus are substantially different from each other.

* * * * *